United States Patent
Rinnen et al.

[11] Patent Number: 5,943,230
[45] Date of Patent: Aug. 24, 1999

[54] COMPUTER-IMPLEMENTED INTER-CHAMBER SYNCHRONIZATION IN A MULTIPLE CHAMBER SUBSTRATE PROCESSING SYSTEM

[75] Inventors: Klaus-Dieter Rinnen, Palo Alto; Cory Czarnik, Mountain View, both of Calif.

[73] Assignee: Applied Materials, Inc., Santa Clara, Calif.

[21] Appl. No.: 08/770,625

[22] Filed: Dec. 19, 1996

[51] Int. Cl.⁶ .................................................. G05B 11/01
[52] U.S. Cl. .................... 364/147; 364/146; 364/468.01; 364/468.28; 427/255.1; 427/255.5; 427/255.7
[58] Field of Search .................................... 364/146, 148, 364/147, 468.01–468.05, 468.28, 729; 118/719, 725; 250/442.11; 156/345, 643; 115/719; 414/217, 225; 204/298.25, 298.26, 298.35; 427/255, 255.7, 255.5

[56] References Cited

U.S. PATENT DOCUMENTS

| | | | |
|---|---|---|---|
| 3,765,763 | 10/1973 | Nygaard | 355/100 |
| 3,812,947 | 5/1974 | Nygaard | 198/19 |
| 4,733,631 | 3/1988 | Boyarsky et al. | 118/719 |
| 4,951,601 | 8/1990 | Maydan et al. | 118/719 |
| 5,105,362 | 4/1992 | Kotani | 364/468 |
| 5,286,296 | 2/1994 | Sato et al. | 118/719 |
| 5,357,115 | 10/1994 | Asakawa et al. | 250/442.11 |
| 5,376,212 | 12/1994 | Saiki | 156/345 |
| 5,458,732 | 10/1995 | Butler et al. | 216/61 |
| 5,486,080 | 1/1996 | Sieradzki | 414/217 |
| 5,512,320 | 4/1996 | Turner et al. | 427/255 |
| 5,561,669 | 10/1996 | Mozumder et al. | 364/552 |
| 5,578,127 | 11/1996 | Kimura | 118/695 |
| 5,785,796 | 7/1998 | Lee | 156/345 |

*Primary Examiner*—William Grant
*Assistant Examiner*—Ramesh Patel
*Attorney, Agent, or Firm*—Townsend & Townsend & Crew

[57] ABSTRACT

A computer-implemented method of achieving inter-chamber synchronization in a system for integrated circuit manufacturing that includes first and second chambers. In particular, the disclosed method includes terminating a second operation in a second recipe carried out in the second chamber, upon termination of a first operation in a first recipe carried out in the first chamber. Performance advantages realized by the method are illustrated for various cases including 1) a variable-length first operation; 2) a fixed-length first operation; 3) a process first recipe; 4) a conditioning first recipe; 5) a process second recipe; and 6) a conditioning second recipe.

39 Claims, 8 Drawing Sheets

COMPUTER-IMPLEMENTED INTER-CHAMBER SYNCHRONIZATION IN A MULTIPLE CHAMBER SUBSTRATE PROCESSING SYSTEM

BACKGROUND OF THE INVENTION

The present invention relates to the fabrication of integrated circuits in substrate processing systems (especially multi-chamber systems). More particularly, the invention provides a technique for synchronizing the operations performed in one chamber with those performed in another chamber in such a system.

Chamber operations can be categorized as either process operations, which are performed with a wafer (i.e. substrate) in the chamber or conditioning operations, which are performed without a wafer in the chamber. Common examples of process operations include deposition, etch, and implantation operations. Common examples of conditioning operations include cleaning, seasoning (i.e. precoating), holding, purging, heating and cooling operations. A seasoning operation is used to deposit a coating on the chamber wall. A hold (or idle) operation serves to delay the performance of the next operation and typically maintains various chamber conditions (such as pressure and temperature). A purge operation is used to flush out of the chamber toxic or reactive gasses left over from one or more previous operations.

A multi-chamber system contains two or more chambers for performing wafer processing operations, one or more robots for transferring wafers between the processing chambers, and one or more transfer chambers which house the robot(s) and are maintained at low atmospheric pressure. Such a system is disclosed and described in U.S. Pat. No. 4,951,601, issued to Maydan et al. and assigned to Applied Materials, Inc., the disclosure of which is hereby incorporated by reference.

Multi-chamber systems are increasingly being used in the fabrication of integrated circuits. Such systems provide advantages over conventional systems, including a reduction in one or more of the following: the number of fabrication steps, the amount of wafer handling and thus the amount of wafer exposure to particulates, cycle time, and fab floor space. However, the use of multi-chamber systems typically requires tighter coordination between the operations performed in the various chambers than is required in comparable substrate processing systems consisting of a series of single-chamber units.

In all multi-chamber systems known to the inventors, individual chambers carry out respective recipes independently of one another (a recipe connoting an ordered set of operations performed as an indivisible group). In other words, events occurring during the performance of a recipe carried out in one chamber do not affect the performance of a recipe being carried out in another chamber.

For various performance reasons, discussed in the detailed description below, it is often desirable for the termination of an operation in a first chamber's recipe to coincide with the termination of an operation in a second chamber's recipe. For example, it might be desirable for a first chamber to carry out a hold operation (during which the chamber conditions are maintained but wafer processing suspended) as long as a second chamber is carrying out a clean operation. The current approach to ensuring simultaneous termination of the hold and clean operations requires specifying a fixed length for the operations. This approach suffers from various problems including the following:

1) The time required for a suitable clean operation depends on a range of factors (such as the number and types of chamber operations performed since the last clean) and is, thus, likely to vary over time. Specifying a fixed length clean operation typically will result in undercleaning and/or overcleaning; the former having a negative impact on subsequent processing operations and the latter resulting in corrosion of the chamber hardware (and thus shorter chamber lifetime and greater down time for the entire processing system because of more frequent chamber replacements). Thus, techniques allowing for variable-length clean operations (such as eadpoint detection, whereby the endpoint of a clean operation is detected as a dramatic change in the chamber concentration of a particular chemical spies) are often preferable to techniques using fixed length clean operations.

2) Even with fixed operation periods, the terminations of the clean and hold operations might not coincide if the termination of the clean operation is delayed for some reason. For example, such a delay could result from the occurrence of a fault condition in the second chamber.

3) Changes in the use of the multi-chamber system containing the first and second chambers may require alteration of the time specified for the clean operation. For example, if the second chamber is used for depositions and the film thickness required for the depositions changes, the time required for an adequate clean will change. En this situation, human intervention (which is both expensive and error-prone) is required to change the time specified for the clean operation and hold operations. This problem is particularly significant for substrate processing systems, such as contract foundries, used to produce many different types of parts.

Because of the above and other similar problems, it is desirable to develop a technique for synchronizing events in one chamber's recipe with events in another chamber's recipe, whereby the termination of an operation (and, in particular, a variable length operation) in a first chamber's recipe could trigger the termination of an operation in a second chamber's recipe.

Another desirable type of inter-chamber synchronization involves causing a recipe to be scheduled for one chamber every time another recipe is schedule for another chamber. For example, a first chamber might perform a clean recipe after processing a certain number (X) of wafers since its last clean recipe. It might be desirable, or even necessary, to suspend normal wafer processing and to carry out a conditioning recipe in a second chamber whenever the first chamber is carrying out a clean recipe. One technique for achieving this result involves maintaining a count of the number of wafers processed in the second chamber since the last time the conditioning recipe was performed, and performing the conditioning recipe every time the count reaches X.

The above technique may not cause the conditioning recipe in the second chamber to be carried out at the desired times (i.e. whenever the first chamber carrying out its clean recipe) because:

1) The count of the number of wafers processed in the second chamber since the last time the conditioning recipe was performed may not equal the number of wafers processed in the first chamber since its last clean. This would occur if one or more of the wafers were processed only in one of the chambers but not in the other.

2) A fault condition might require a clean of the first chamber before X wafers have been processed since the last clean.

Current solutions to the above problem involve constant human monitoring. What would be desirable is a more reliable and less expensive technique for ensuring that a particular conditioning recipe is carried out in a second chamber every time a clean recipe is carried out in a first chamber.

SUMMARY OF THE INVENTION

A computer-implemented method of achieving inter-chamber synchronization in a system for integrated circuit manufacturing is disclosed. In particular, the disclosed method includes terminating a second operation in a second recipe carried out in a second chamber, upon termination of a first operation in a first recipe carried out in a first chamber. Performance advantages realized by the method are illustrated for various cases including 1) a variable-length first operation; 2) a fixed-length first operation; 3) a process first recipe; 4) a conditioning first recipe; 5) a process second recipe; and 6) a conditioning second recipe.

Another aspect of the invention involves a computer-implemented method for achieving inter-chamber synchronization between first and second chambers by scheduling a conditioning recipe in the second chamber whenever a cleaning operation is scheduled in the first chamber.

Yet another aspect of the invention involves a computer-implemented method for calculating in advance a length for a variable-length operation to be carried out in a chamber at a particular time. The method includes 1) determining that one or more operations have been performed in the chamber during a particular time interval prior to the particular time and 2) using information obtained during the determining step to calculate the length for the variable-length operation.

A further understanding of the nature and advantages of the present invention may be realized by reference to the remaining portions of the specification and the drawings.

DESCRIPTION OF THE PREFERRED EMBODIMENT

The invention and examples of inter-chamber coordination problems are described below, with reference to the particular system illustrated in FIG. 1. However, the invention is not limited to this particular system, or to the particular inter-chamber coordination problems discussed.

I. Exemplary Multi-chamber System

Figure 1:
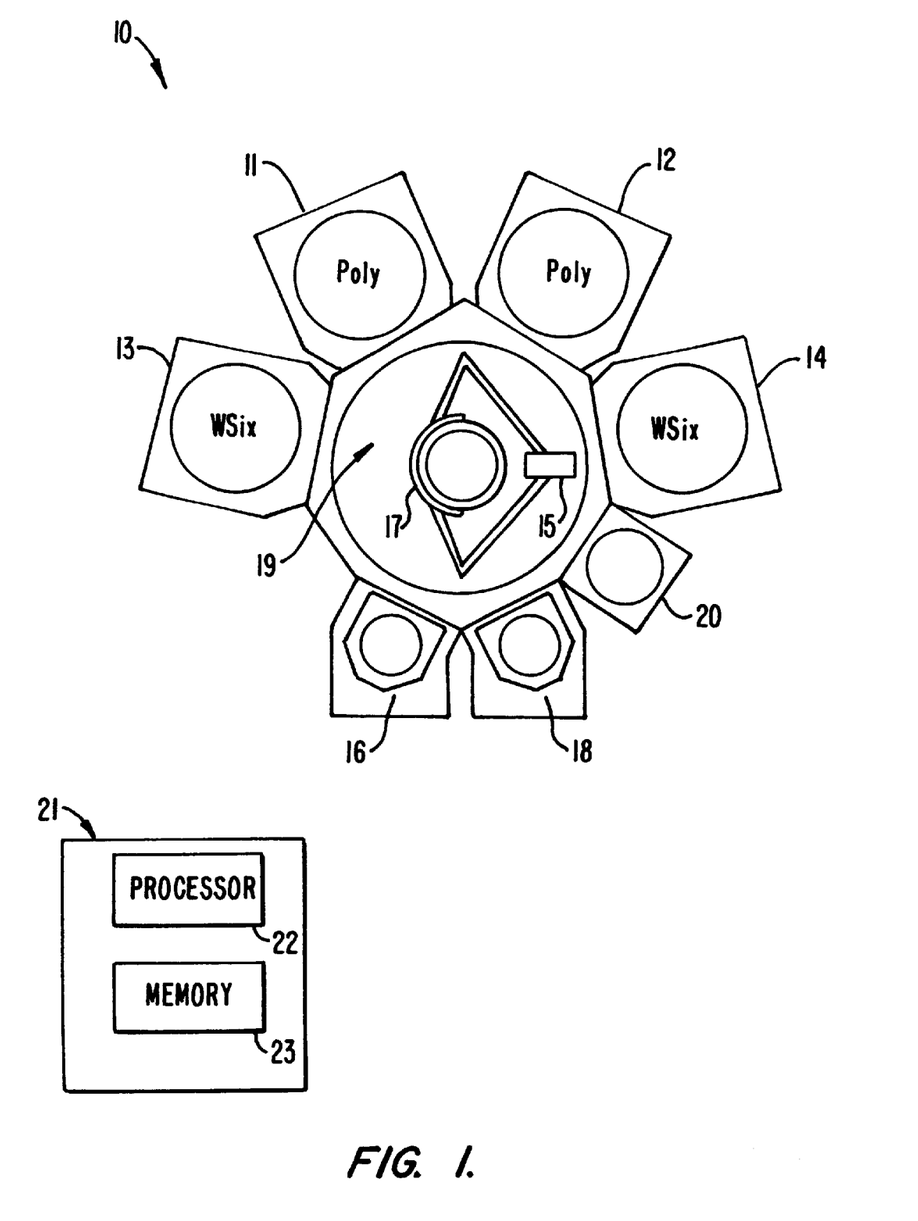
FIG. 1 illustrates a multi-chamber system.

FIG. 1 depicts a particular multi-chamber system 10 (known as the Polycide Centura Integrated System, and available from Applied Materials, Inc. of Santa Clara, Calif.) for forming a layered structure called a "polycide" structure. A polycide structure consists of a low resistivity tungsten silicide ($WSi_x$) film deposited over, or formed by chemical reaction with, a layer of polycrystalline silicon polysilicon). System 10 includes two poly chambers 11 and 12 and two $WXi_x$ chambers 13 and 14. The poly chambers are used to deposit a layer of polysilicon, while chambers 13 and 14 are used to deposit tungsten (or tungsten silicide). Many methods of forming tungsten silicide ($WSi_x$ layers exist. In one embodiment, a $WSI_x$ layer is created in chambers 13 and 14 via a reaction of dichlorosilane ($SiH_2Cl_2$) (hereinafter referred to as "DCS") with $WF_6$.

System 10 includes a transfer chamber 19 (which is maintained at a low pressure), two load locks 16 and 18 (through one of which each wafer enters and leaves system 10), a cool down chamber 20 (where a fully processed wafer is placed before exiting system 10 via one of load locks 16 and 18) and a robot 17 that manipulates a blade 15 (on which wafers are placed) to transfer wafers between the. poly and $WSi_x$ chambers, the load locks and the cool down chamber. Poly chambers 11 and 12 typically are paired with $WSi_x$ chambers 13 and 14, respectively, in which case a wafer that is processed in poly chamber 11 (12) is then processed in $WSi_x$ chamber 13 (14).

Each wafer is introduced to integrated system 10 via one of load locks 16 and 18. Once a wafer is positioned within a load lock, the load lock is pumped down to a low pressure. Then robot 17 transfers the wafer from the load lock to one of the poly chambers. After processing in the poly chamber terminates, robot 17 transfers the wafer to the $WSi_x$ chamber paired to the poly chamber. After one of $WSi_x$ chambers 13 and 14 fully processes the wafer, robot 17 transfers the wafer to cool down chamber 20, and then to one of load locks 16 and 18 (which will then be pumped up to atmospheric pressure prior to releasing the wafer to the outside).

II. Computer Control of System 10

As indicated in FIG. 1, system 10 includes a controller 21 that controls the activities carried out in the chambers of system 10 and the transfer of wafers by robot 17. Controller 21 includes a processor 22 and a memory 23. Processor 22 executes system control software, which is a computer program stored in a computer-readable medium such as memory 23. Preferably, memory 23 is a hard disk drive, but memory 23 may also be other kinds of memory. The system control software includes sets of instructions that dictate the timing, mixture of gases, chamber pressure, chamber temperature, RF power levels, susceptor position, and other parameters of a particular process. Of course, other computer programs such as one: stored on another memory device including, for example, a floppy disk or other another appropriate drive, may also be used to operate the computer.

The system control software can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 2:
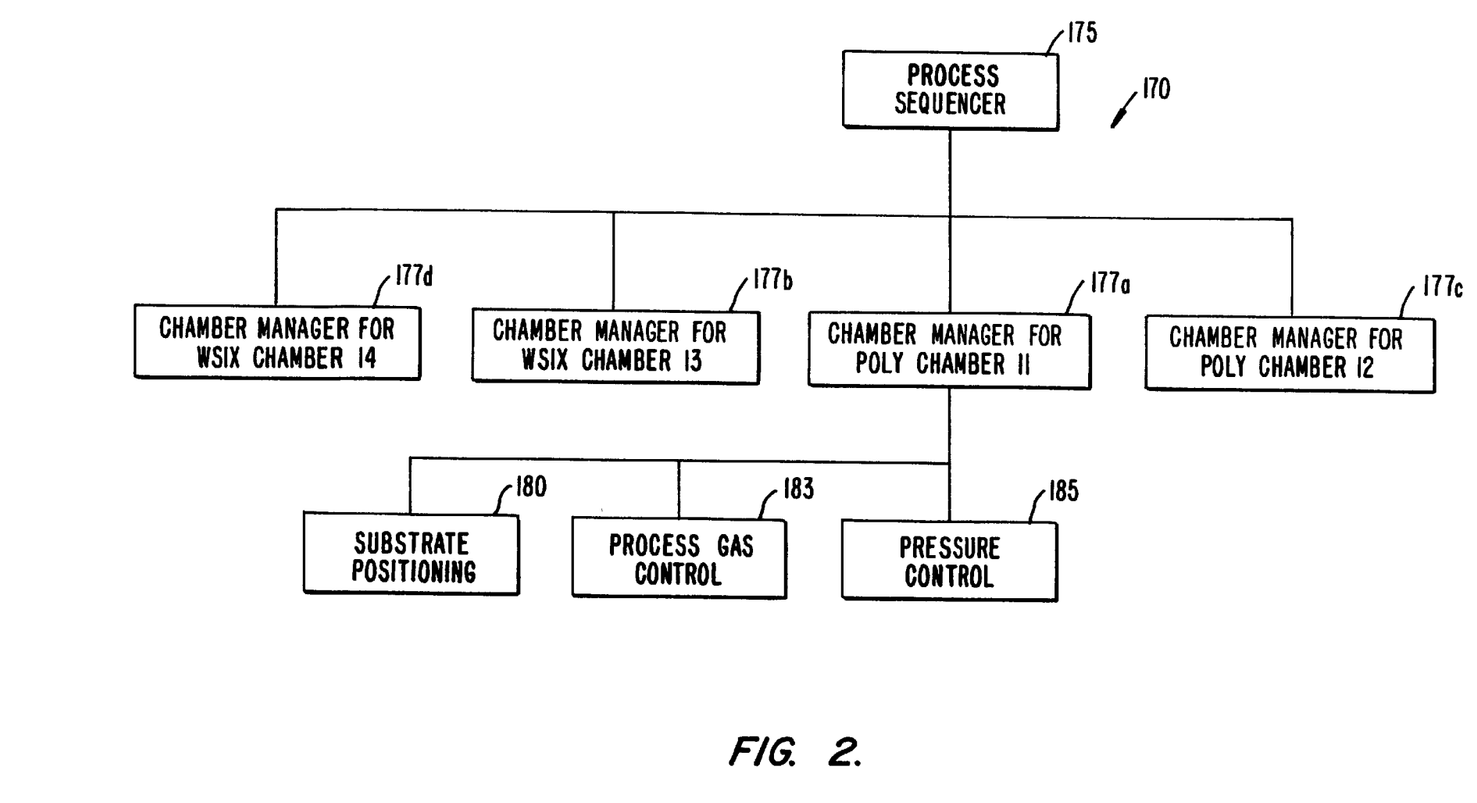
FIG. 2 illustrates a block diagram for control software used to operate the system of FIG. 1.

FIG. 2 is an illustrative block diagram of the hierarchical control structure of the system control computer program 170, according to a specific embodiment. A process sequencer subroutine 175 comprises program code for controlling operation of the various chambers of system 10, via chamber managers 177a–d, which in response to commands from sequencer 175 cause chambers 11, 13, 12, and 14, respectively, to carry out recipes. A recipe is an ordered sequence of operations carried out as an indivisible group by a chamber. Each recipe specifies, for each of its operations, a set of operation parameters needed to operate a chamber and its supporting equipment for performing the desired operation. The operation parameters for performing a specific operation relate to process conditions such as, for example,. process gas composition and flow rates, temperature, pressure, plasma conditions such as RF power levels, and chamber wall temperature.

Recipes can be categorized as process recipes or conditioning recipes. A process recipe contains process operations, which are performed with a wafer in the chamber. A conditioning recipe contains conditioning operations, which are performed without a wafer in the chamber. Examples of conditioning operations include clean, seasoning (i.e. precoating), hold/wait, purge, heating and cooling operations. Examples of process operations include deposition, hold/wait, preconditioning, etching, implantation, diffusion, and annealing operations.

Each of chamber manager subroutines 177a–d controls execution of various chamber component subroutines which control operation of the components of the corresponding chamber that are necessary to achieve a set of operation parameters specified for a recipe operation. Examples of chamber component subroutines used by chamber manager 177a (the other chamber managers use similar routines) are substrate positioning subroutine 180, process gas control subroutine 183, and pressure control subroutine 185. The latter two operations are invoked by chamber manager 177a in carrying out both process and conditioning recipes. Those having ordinary skill in the art will recognize that other chamber control subroutines can be included depending on what operations are desired to be performed in poly chamber 11. En operation, the chamber manager subroutine 177a selectively schedules or calls the chamber component subroutines in accordance with the set of operation parameters defining the operation being executed. Typically, the chamber manager subroutine 177a includes steps of monitoring the various chamber components, determining which components need to be operated based on the parameters for the operation to be executed, and causing execution of a chamber component subroutine responsive to the monitoring and determining steps.

Operation of particular chamber component subroutines will now be described with reference to FIG. 2. The substrate positioning subroutine 180 comprises program code for controlling chamber components that are used to load the substrate onto a susceptor, and optionally to lift the substrate to a desired height in the chamber to control the spacing between the substrate and a gas distribution manifold. When a substrate is loaded into a chamber, the susceptor is lowered to receive the substrate,,and thereafter, the susceptor is raised to the desired height in the chamber, to maintain the substrate at a first distance or spacing from the gas distribution manifold during the operation. In operation, the substrate positioning subroutine 110 controls movement of the susceptor in response to operation parameters related to the support height that are transferred from the chamber manager subroutine 177a.

The process gas control subroutine 183 includes program code for controlling process gas composition and flow rates. The process gas control subroutine 183 controls the open/close position of the safety shut-off valves, and also ramps up/down the mass flow controllers to obtain the desired gas flow rate. The process gas control subroutine 183 is invoked by the chamber manager subroutine 177a, as are all chamber component subroutines, and receives from the chamber manager subroutine operation parameters related to the desired gas flow rates. Typically, the process gas control subroutine 183 operates by opening the gas supply lines, and repeatedly (i) reading the necessary mass flow controllers, (ii) comparing the readings to the desired flow rates received from the chamber manager subroutine 177a, and (iii) adjusting the flow rates of the gas supply lines as necessary.

In some processes, an inert gas such as argon is introduced into the chamber to stabilize the pressure in the chamber before reactive process gases are introduced into the chamber. For these processes, the process gas control subroutine is programmed to include steps for introducing the inert gas into the chamber for a time necessary to stabilize the pressure in the chamber, and then the steps described above are carried out.

The pressure control subroutine 185 comprises program code for controlling the pressure in the chamber by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 185 is invoked, the desired, or target, pressure level is received as a parameter from the chamber manager subroutine 177a. The pressure control subroutine 185 operates to measure the pressure in the chamber by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 185 can be written to open or close the throttle valve to a particular opening size to maintain chamber 11 at the desired pressure. Furthermore, the pressure gas control subroutine 185 includes steps for monitoring the chamber pressure for unsafe conditions, and activating the safety shut-off valves when an unsafe condition is detected.

III. Inter-Chamber Synchronization

Poly chamber 11 and $WSi_x$ chamber 13 have differing cleaning requirements, both induration and frequency. In one embodiment, cleaning of $WSi_x$ chamber 13 are more frequent (e.g. every 25 wafers), but of shorter duration (e.g.

15–20 minutes), than cleans of poly chamber 102 (e.g. every 300 wafers, 40–45 minute duration). For various reasons, it may be desirable for chambers 11 and 13 to suspend ordinary processing while the other is performing its clean.

For instance, poly chamber 11 should not process a wafer while $WSi_x$ chamber 13 is performning its clean operation. Otherwise, that wafer would remain in poly chamber 11, which is maintained at a very high temperature, while $WSi_x$ chamber 13 is completing its clean. The overexposure to high temperature may cause device degradation to occur. Thus, typically poly chamber 11 would stop processing new wafers and instead would perform a conditioning recipe to maintain various operating conditions in chamber 11 while $WSi_x$ chamber 13 performs its cleaning operation.

While poly chamber 11 performs its cleaning operation (typically for 40–45 minutes), $WSi_x$ chamber 13 could just remain in a hot idle state (after processing the wafer last processed by poly chamber 11) awaiting the next wafer to be transferred from poly chamber 11. However, an improvement in the wafer throughput of system 10 is achieved by having $WSi_x$ chamber 13 perform its cleaning operation during the much longer cleaning of poly chamber 11. This delays for as long as possible, the first required cleaning of $WSi_x$ chamber 13 after chambers 11 and 13 resume normal wafer processing. For example, if $WSi_x$ chamber 13 had processed 24 wafers between the time of the last clean of $WSi_x$ chamber 13 and the time $WSi_x$ chamber 13 suspended normal wafer processing (on account of a clean of poly chamber 11), a clean of $WSi_x$ chamber 13 (if not performed during the clean of poly chamber 11) would be required after processing the first wafer it would receive after the clean of poly chamber 11. By performing a clean of $WSi_x$ chamber 13 during the clean of poly chamber 11, the next clean of $WSi_x$ chamber 13 is delayed for 25 wafers.

In addition to performing a clean of $WSi_x$ chamber 13 during the clean of poly chamber 11, it would be desirable for $WSi_x$ chamber 13 to perform a precoating operation (essentially a deposition of a seasoning layer on the wall of $WSi_x$ chamber 13) immediately before receiving the first wafer after the end of the clean of poly chamber 11. This precoating operation can improve the consistency of film quality by minimizing the "idle effect," which causes the layers of $WSi_x$ deposited on the first few wafers processed by $WSi_x$ chamber 13 after an idle period to have a lower sheet resistivity than layers deposited on subsequently and previously processed wafers. Unlike some of the other performance issues discussed herein (such as wafer throughput, overcleaning and device degradation due to overexposure to high temperature), idle effect is an issue that is only relevant to dichlorosilane-based $WSi_x$ applications. However, problems similar to the above described idle effect may be present in certain applications.

Figure 3:
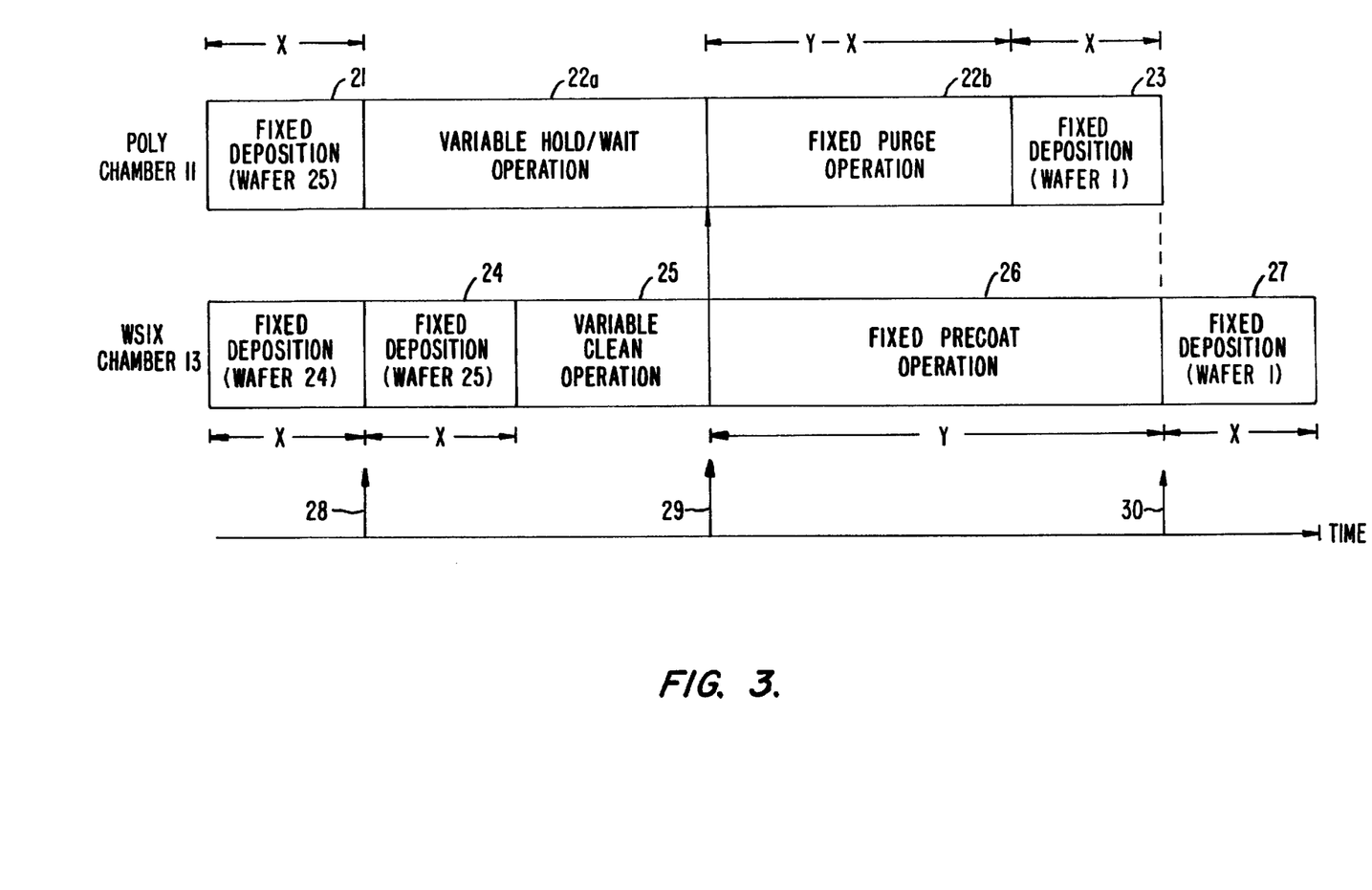
FIGS. 3 illustrates an inter-chamber synchronization technique used to synchronize operations carried out in a poly chamber and a $WSi_x$ chamber whenever a clean operation is scheduled for the $WSi_x$ chamber.

FIG. 3 depicts a series of operations performed in chambers 11 and 13, in one embodiment, when a clean operation is required in $WSi_x$ chamber 13. In this example, a clean operation in $WSi_x$ chamber 13 is required after every 25 wafer deposition operations, and wafer deposition operation 24 is the 25th such operation $WSi_x$ chamber 13 has performed since its last clean. At a time 28, just after poly chamber 11 has finished processing a wafer in a deposition operation 21, process sequencer 175 schedules a transfer of the wafer from poly chamber 11 to $WSi_x$ chamber 13.

Upon completion of the transfer, sequencer 175 increments a count (stored in memory 23) of the number of wafers processed in chamber 13 since the last clean of chamber 13. This count is incremented whenever sequencer 175 transfers a wafer into chamber 13, even when the wafer is transferred directly from one of load locks 16 and 18, i.e. does not undergo deposition in poly chamber 11. When the count is at 24, sequencer 175 resets the count to 0 upon the transfer of the next wafer into chamber 13.

Whenever sequencer 175 schedules a wafer transfer to $WSi_x$ chamber 13 (from any source, i.e. either from poly chamber 11 or directly from one of load locks 16 and 18), sequencer 175 accesses the above count and, if the count is at 24, schedules respective conditioning recipes to be performed in chambers 11 and 13, as described below. (In addition, sequencer 175 can decide to schedule these conditioning recipes at other times, such as upon an occurrence of a fault in chamber 13 necessitating an immediate clean of chamber 13.) For example, at approximately time 28, sequencer 175 determines that the above count is 24, and that a wafer is scheduled to be transferred into chamber 13. As a result, process sequencer 175 determines that $WSi_x$ chamber 13 will be due for cleaning (after processing the wafer scheduled to be transferred into chamber 13) and thus schedules a conditioning recipe for chamber manager 177b to carry out in chamber 13 after the wafer transferred into chamber 13 undergoes deposition in a fixed-length deposition operation 24 requiring x minutes. This conditioning recipe consists of a variable-length clean operation 25, followed by a fixed-length precoating operation 26 of length y minutes.

Also at approximately time 28, process sequencer 175 directs chamber manager 177a to carry out a conditioning recipe in poly chamber 11, which recipe serves to maintain various operating conditions of poly chamber 11 (such as temperature and pressure) and consists of a variable-length hold/wait operation 22a, followed by a fixed-length purge operation 22b of length y-x minutes. At time 29, variable-length clean operation 25 in $WSi_x$ chamber 13 terminates. In response to the termination of variable-length clean operation 25 in $WSi_x$ chamber 13, chamber manager 177a causes poly chamber 11 to terminate variable-length hold/wait operation 22a and to commence fixed-length purge operation 22b.

After poly chamber 11 finishes performing fixed-length purge operation 22b, process sequencer 175 transfers a new wafer into chamber 13 and directs chamber manager 177a to perform a deposition operation 23 on the new wafer (having a fixed length of x minutes). At a time 30, poly chamber 11 and $WSi_x$ chamber 13 finish performing deposition operation 23 and precoating operation 26, respectively, and $WSi_x$ chamber 13 is ready to perform a deposition operation 27 on the wafer worked on by poly chamber 11 in deposition operation 23.

A key feature of the synchronization depicted in FIG. 3, is that the transition between two operations of the conditioning recipe performed in poly chamber 11 (i.e. variable-length hold/wait operation 22a land fixed-length purge operation 22b) is triggered when $WSi_x$ chamber 13 reaches a particular state during the processing of its conditioning recipe (i.e. upon completion of variable-length clean operation 25). This feature permits the simultaneous achievement of three objectives: 1) variable length cleans of $WSi_x$ chamber 13; 2) maximum wafer throughput (i.e. immediately after $WSi_x$ chamber 13 finishes precoating operation 26 a wafer is ready to be processed by $WSi_x$ chamber 13); and 3) minimization of the "idle effect" (i.e. $WSi_x$ chamber 13 immediately starts processing wafers after finishing precoating operation 26). Without this feature, one of the following alternatives would have to be chosen:

a) a fixed-length clean of $WSi_x$ chamber 13. This could result in insufficient or excessive cleaning, either of which are undesirable. In addition, excessive cleaning would result in suboptimal wafer throughput.

b) modifying the conditioning recipe 22 performed by poly chamber 11 to have only a fixed-length hold/wait operation. To avoid the possibility of wafer deposition operation 23 completing before precoating operation 26 (i.e. before $WSi_x$ chamber 13 is ready to receive the wafer newly processed in poly chamber 11), and thus the risk of device degradation (due to overexposure to the high temperature of poly chamber 11), the fixed-length hold/wait of poly chamber 11 would have to have a, length equal to the sum of the largest possible duration of poly chamber 11's variable-length clean operation 25 and the length of precoating operation 26. However, if the length of poly chamber 11's hold/wait were fixed at such a high value, usually precoating operation 26 would finish before wafer deposition operation 23, thereby resulting in suboptimal wafer throughput and greater "idle effect" in $WSi_x$ chamber 13.

In one embodiment, synchronization between the termination of variable-length clean operation 25 in $WSi_x$ chamber 13 and the transition between variable-length hold/wait operation 22a and fixed-length purge operation 22b is achieved by the following technique: Memory 23 stores respective flag bits for each of chambers 11–14. When variable clean operation 25 is terminated by chamber manager 177b, chamber manager 177b sets the flag bit for poly chamber 11. After chamber manager 177a starts variable-length hold/wait operation 22a, it periodically accesses the flag bit for poly chamber 11. When the accessed flag bit is determined to be set, chamber manager 177a terminates variable-length hold/wait operation 22a, and starts fixed-length purge operation 22b. At the beginning of each recipe operation, each of chamber managers 177a–d resets the flag bit for its corresponding chamber, thereby preventing a setting of the flag bit from triggering more than one transition in the chamber's recipe.

In some circumstances it might be desirable, upon determining that chamber 13 is due for a clean, for sequencer 175 to schedule a clean for chamber 11 if a clean for chamber 11 would be required in any event in the relatively near future. In one embodiment, upon determining that chamber 13 is due for a clean at approximately time 28 (as described above), sequencer 175 accesses a count stored in memory 23 indicating the number of wafers processed by chamber 11 since the last clean of chamber 11. If the count exceeds ninety percent of the maximum number of wafers processed by chamber 11 between cleans, sequencer 175 directs chamber managers 177a–b to perform in chambers 11 and 13 respective conditioning recipes (both of which include a clean operation) illustrated in FIG. 4 (and discussed below) instead of the conditioning recipes described in the above discussion of FIG. 3. For example, if the maximum number of wafers processed by chamber 11 between cleans is 300, then sequencer 175 takes the above action whenever the count exceeds 270.

Figure 4:
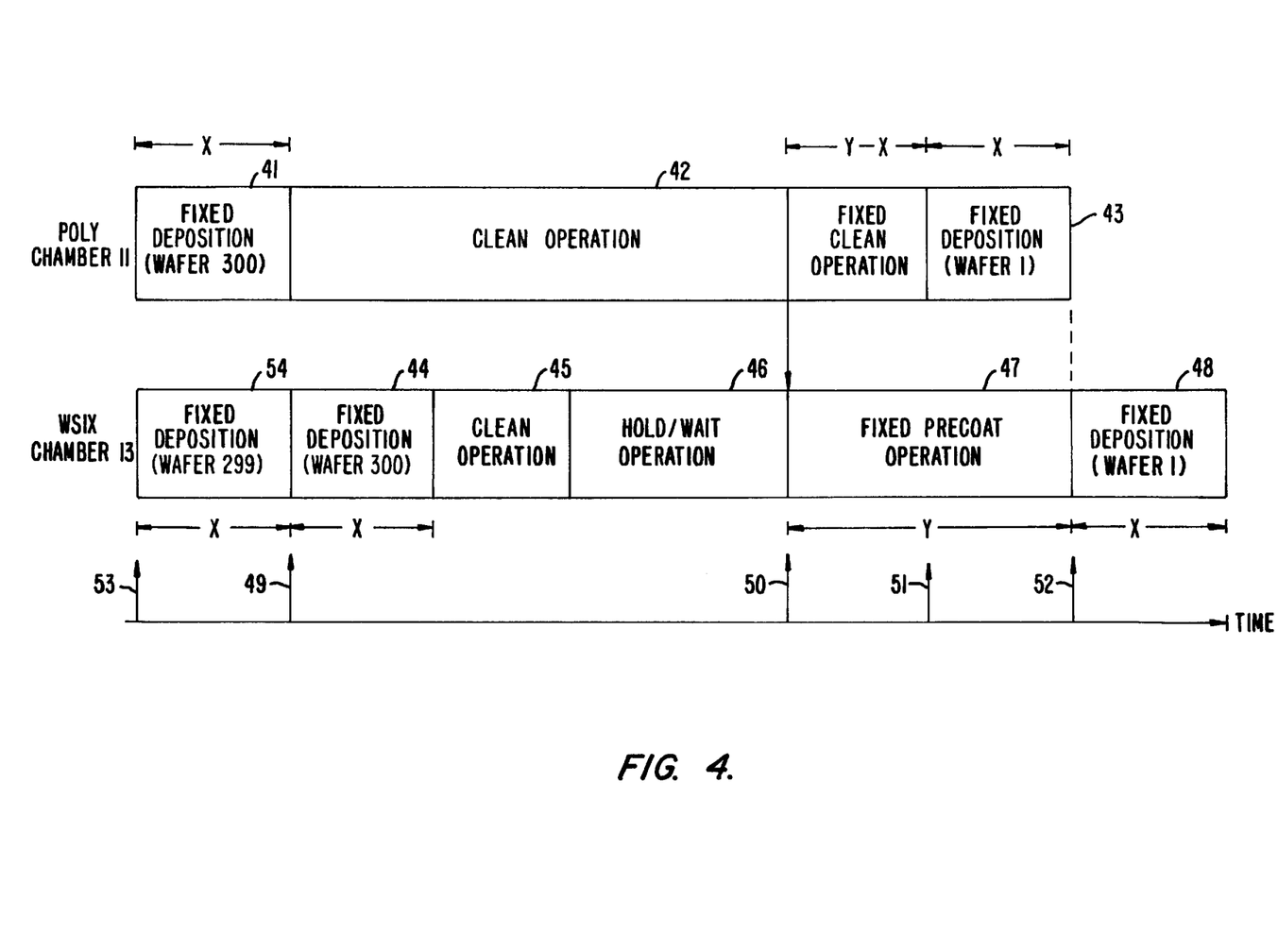
FIG. 4 illustrates an inter-chamber synchronization technique used to synchronize operations carried out in a poly chamber and a $WSi_x$ chamber whenever a clean operation is scheduled for the poly chamber.

FIG. 4 depicts a series of operations performed in chambers 11 and 13, in one embodiment, when a clean operation is required in poly chamber 11. At time 53, a wafer deposition operation 41 starts in poly chamber 11. In this example, a clean operation in poly chamber 11 is required after every 300 wafer deposition operations, and wafer deposition operation 41 is the 300th such operation poly chamber 11 has performed since its last clean.

At approximately time 53 (and every time sequencer 175 directs the transfer of a wafer into poly chamber 11), sequencer increments a count (stored in memory 23) of the number of wafers processed by poly chamber 11 since the last clean of poly chamber 11. Upon determining (at approximately time 53) that this count has reached 300, process sequencer 175 resets the count to 0 and directs chamber manager 177a to perform a conditioning recipe in poly chamber 11. This recipe consists of a first fixed-length clean operation 42 (in some embodiments operation 42 could be variable-length), followed by a second fixed-length clean operation 53 of length y-x minutes (where x minutes is the fixed length of deposition operations performed in poly chamber 11, and y is the fixed length of precoating operations performed in $WSi_x$ chamber 13, as described below).

Also, at approximately time 53, process sequencer 175 directs chamber manager 177b to perform a conditioning recipe in $WSi_x$ chamber 13, after carrying out fixed-length deposition operations 44 and 54 (each of which requires x minutes). (The conditioning recipe in $WSi_x$ chamber 13 is performed without first carrying out fixed-length deposition operation 44, in the event that the wafer processed in chamber 111 during operation 41 is not to be transferred to chamber 13.) This conditioning recipe, consists of a variable-length clean operation 45 (which could be fixed-length in other embodiments), followed by a hold/wait operation 46 and followed by a precoating operation 47 of fixed length (i.e. y minutes). As described above, a clean of $WSi_x$ chamber 13 is performed during the periodic clean of poly chamber 11 to postpone, for as long as possible, the first clean of $WSi_x$ chamber 13 required after poly chamber 11 resumes wafer depositions.

At time 49, just after poly chamber 11 has processed a wafer in deposition operation 41, robot 17 passes the wafer from poly chamber 11 to $WSi_x$ chamber 13 for processing in deposition operation 44. Also, at approximately time 49, process sequencer 175 resets a count (stored in memory 23) of the number of wafers processed by $WSi_x$ chamber 13 since the last clean of chamber 13 to zero.

At time 50, chamber manager 177a terminates clean operation 42 in poly chamber 11, and sets the flag bit in memory 23 for $WSi_x$ chamber 13. After chamber manager 177b starts hold/wait operation 46, chamber manager 177b periodically accesses the flag bit for chamber 13. Upon detecting (at approximately time 50) that the accessed bit has been set, chamber manager 177b terminates hold/wait operation 46 and starts precoat operation 47. At a time 51, after finishing clean operation 53, poly chamber 11 performs a fixed-length deposition operation 43 (requiring x minutes) on a new wafer. At a time 52, poly chamber 11 and $WSi_x$ chamber 13 finish performing deposition operation 43 and precoating operation 47, respectively, and $WSi_x$ chamber 13 is ready to perform a deposition operation 48 on the wafer processed by poly chamber 11 in deposition operation 43.

The ability to communicate to $WSi_x$ chamber 13 the completion of clean operation 42 in poly chamber 11, permits precoating operation 47 in $WSi_x$ chamber 13 to terminate at the same time as deposition operation 43 in poly chamber 11. The three goals of 1) maximizing wafer throughput, 2) minimizing "idle effect" in $WSi_x$ chamber 13, and 3) avoiding device degradation (due to overexposure of wafers to the high temperature environment of poly chamber 11) are thereby achieved. As with the synchronization depicted in FIG. 3, a key feature of the synchronization depicted in FIG. 4, is the triggering of the transition between two operations of the conditioning recipe performed in $WSi_x$ chamber 13 (i.e. hold/wait operation 46 and precoat operation 47) when poly chamber 11 reaches a particular state during execution of its conditioning (i.e. upon completion of clean operation 42).

Sequencer 175 might direct chamber managers 177a–b to carry out the conditioning recipes illustrated in FIG. 4 at times other than that described above (i.e. after the processing of the 300th wafer in chamber 11 since the last clean of chamber 11), such as upon determination of a fault condition in chamber 11 necessitating an immediate clean of chamber 11.

Figure 5:
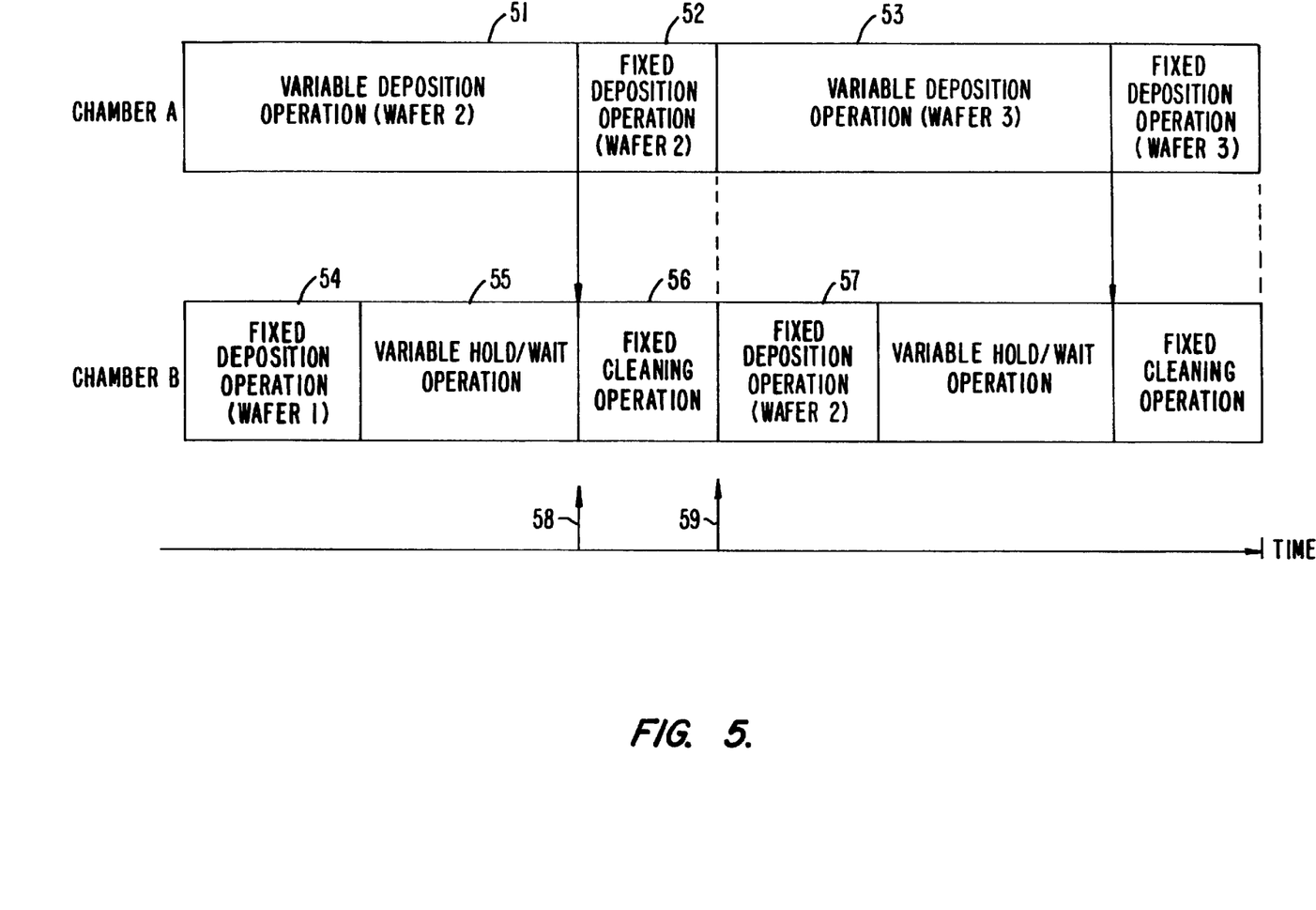
FIG. 5 illustrates an inter-chamber synchronization technique used to synchronize operations carried out in two chambers (A and B), whereby the occurrence of an event during the execution of a process recipe performed in chamber A affects the execution of a conditioning recipe performed in chamber B.

While FIGS. 3 and 4 depict synchronization between conditioning recipes, the invention is equally applicable to synchronization between two process recipes and to synchronization between a process recipe and a conditioning recipe. FIG. 5 depicts a synchronization scheme between two chambers (A and B), whereby the occurrence of an event during the execution of a process recipe performed in chamber A affects the execution of a conditioning recipe performed in chamber B.

Each wafer undergoes a deposition in chamber A, followed by a deposition in chamber B. The process recipe carried out by chamber A consists of a variable-length deposition operation (e.g. operation 51), followed by a fixed-length deposition operation (e.g. operation 52). (In other embodiments, operation 51 could be another type of variable-length process operation, such as an etch operation.) Chamber B alternates between performing a process recipe consisting of a fixed-length deposition operation (e.g. operation 54), and performing a conditioning recipe consisting of a variable-length hold/wait operation (e.g. operation 55), followed by a fixed-length cleaning operation (e.g. operation 56). Using the synchronization techniques described above (i.e. respective flag bits for chambers A and B), chamber B stops performing its variable-length hold/wait operation for a particular wafer when the variable-length deposition operation performed by chamber A on the next wafer terminates (e.g. the termination of operation 51 in chamber A at time 58 triggers the transition from operation 55 to operation 56 in chamber B). In this way, the fixed-length deposition operation of chamber A's process recipe on a particular wafer and the fixed-length cleaning operation of chamber B's conditioning recipe on the previous wafer (which operations are, by design, of equal length) start, and thus finish, at approximately the same time (e.g. time 59). As a result, the problems of overexposure of processed wafers to the high temperature environment of chamber A and suboptimal wafer throughput (both of which could occur if the former operation terminated first) and inconsistency in film quality on account of idle-effect in chamber B (which could occur if the latter operation terminated first) may be avoided.

Even if the first deposition operation of chamber A's process recipe were of fixed length, benefits similar to those described immediately above, could arise from synchronizing the termination of that operation in chamber A with the termination of the hold/wait operation of chamber B's conditioning recipe. Such synchronization would ensure that the second deposition operation of chamber A's process recipe and the cleaning operation of chamber B's conditioning recipe terminate approximately simultaneously, even if for some reason (e.g. a fault of some kind) the completion of the first deposition operation of chamber A's process recipe were delayed.

Figure 6:
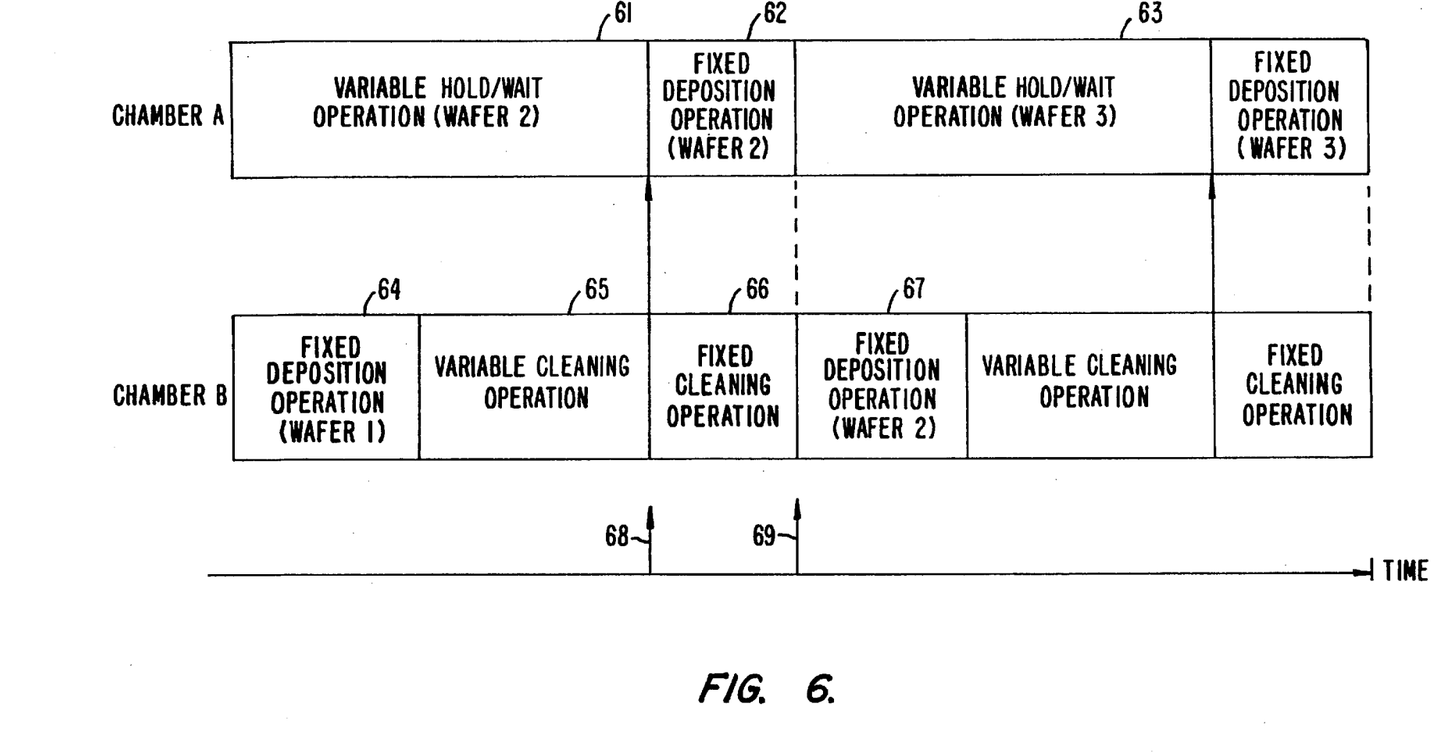
FIG. 6 illustrates an inter-chamber synchronization technique used to synchronize operations carried out in two chambers (A and B), whereby the occurrence of an event during the execution of a conditioning recipe performed in chamber A affects the execution of a process recipe performed in chamber B.

FIG. 6 depicts a synchronization scheme between two chambers (A and B), whereby the ocurrence of an event during the execution of a conditioning recipe performed by chamber B affects the execution of a process recipe in chamber A. Each wafer undergoes a deposition in chamber A, followed by a deposition in chamber B. The process recipe carried out by chamber A consists of a variable-length hold/wait operation (e.g. operation 61), followed by a fixed-length deposition operation (e.g. operation 62). Chamber B alternates between performing a process recipe consisting of a fixed-length deposition operation (e.g. operation 64), and performing a conditioning recipe consisting of a variable-length cleaning operation (e.g. operation 65), followed by a fixed-length cleaning operation (e.g. operation 66). Using the synchronization technique described above, chamber A stops performing its variable-length hold/wait operation for a particular wafer when the variable-length cleaning operation performed by chamber B on the previous wafer terminates (e.g. the termination of operation 65 in chamber B at time 68 triggers the transition from operation 61 to operation 62 in chamber A). In this way, the fixed-length deposition operation of chamber A's process recipe on a particular wafer and the fixed-length cleaning operation of chamber B's conditioning recipe on a previous wafer (which operations are, by design, of equal length) start, and thus finish, at approximately the same time (e.g. at time 69). As a result, the problems of overexposure of processed wafers to the high temperature environment of chamber A (which could occur if the former operation terminated first) and inconsistency in film quality on account of idle-effect in chamber B (which could occur if the latter operation terminated first) may be avoided.

Even if the first cleaning operation of chamber B's conditioning recipe were of fixed length, benefits similar to those described immediately above, could arise from synchronizing the termination of that operation in chamber B with the termination of the hold/wait operation of chamber A's process recipe. Such synchronization would ensure that the deposition operation of chamber A's process recipe and the second cleaning operation of chamber B's conditioning recipe terminate approximately simultaneously, even if for some reason (e.g. a fault of some kind) the completion of the first cleaning operation of chamber B's conditioning recipe were delayed.

Figure 7:
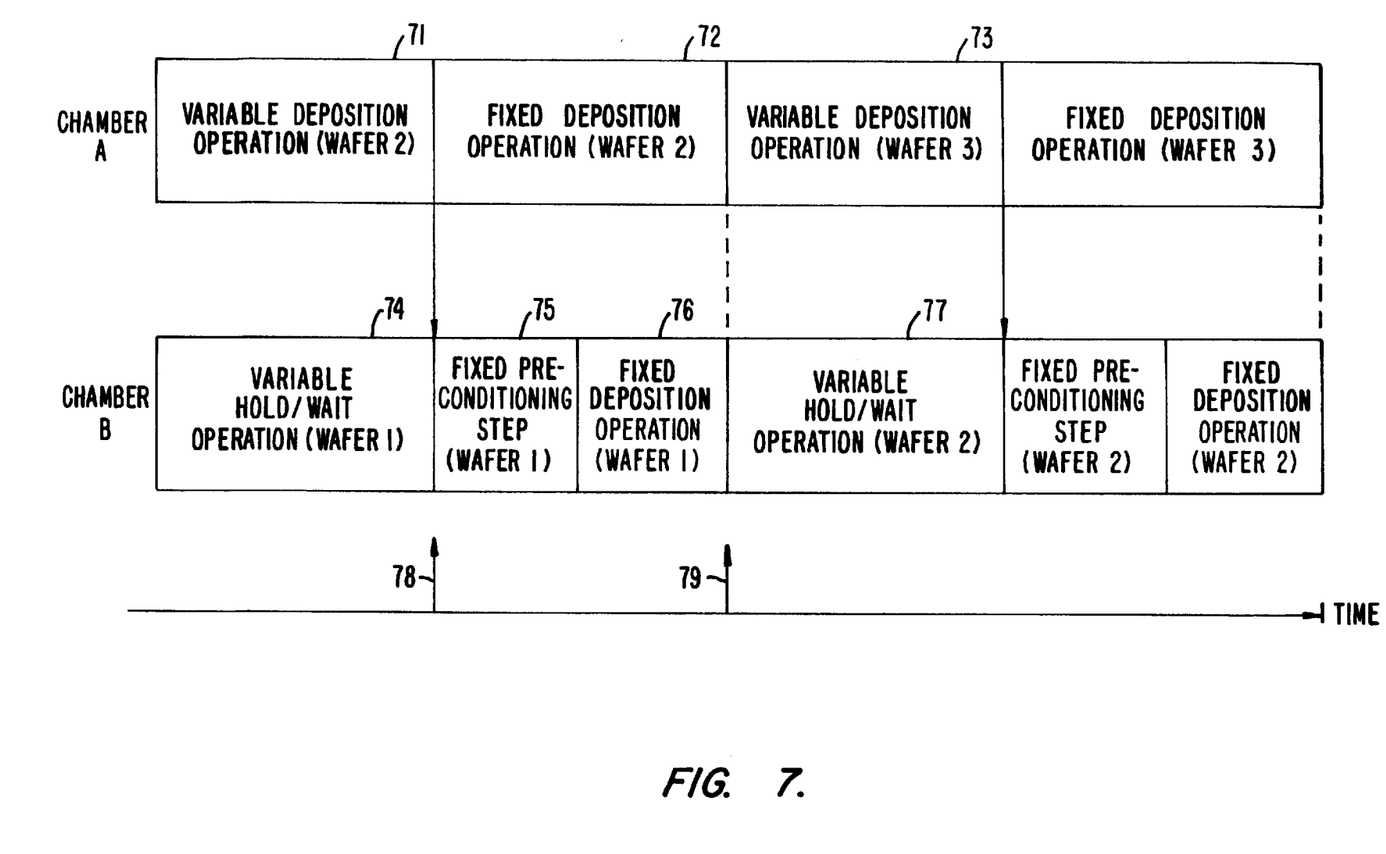
FIG. 7 illustrates an inter-chamber synchronization technique used to synchronize operations carried out in two chambers (A and B), whereby the occurrence of an event during the execution of a process recipe performed in chamber A affects the execution of a process recipe performed in chamber B.

FIG. 7 depicts a synchronization scheme between two chambers (A and B), whereby the occurrence of an event during the execution of a process recipe performed by chamber A affects the execution of a process recipe in chamber B. Each wafer undergoes a deposition in chamber A, followed by a deposition in chamber B. The process recipe carried out by chamber A consists of a variable-length deposition operation (e.g. operation 71), followed by a fixed-length deposition operation (e.g. operation 72). (In other embodiments, operation 71 could be another type of variable-length process operation, such as an etch operation.) Chamber B executes a process recipe consisting of a variable-length hold/wait operation (e.g. operation 74), followed by a fixed preconditioning operation (e.g. operation 75), followed by a fixed-length deposition operation (e.g. operation 76).

Using the synchronization technique described above, chamber B stops performing its variable-length hold/wait operation for a particular wafer when the variable-length deposition operation performed by chamber A on the next wafer terminates (e.g. the termination of operation 71 in chamber A at time 78 triggers the transition from operation 74 to operation 75 in chamber B). The fixed deposition operation of chamber A's process recipe is designed to have a length equal to the sum of the lengths of the fixed-length preconditioning and deposition operations of chamber B's process recipe. In this way, the fixed-length deposition operation of chamber A's process recipe on a particular wafer and the fixed-length deposition operation of chamber B's process recipe on a previous wafer finish at approximately the same time (e.g. time 79). As a result of this synchronization, wafer throughput is maximized and overexposure of processed wafers to the high temperature environment of chamber A is avoided (because chamber B is always ready to receive a processed wafer from chamber A), and inconsistency in film quality on account of idle-effect in chamber B (which could occur if the latter operation terminated first) is reduced (on account of the fixed preconditioning operation that is performed during chamber B's process recipe before the fixed deposition operation).

Even if the first deposition operation of chamber A's process recipe were of fixed length, benefits similar to those described immediately above, could arise from synchronizing the termination of that operation in chamber A with the termination of the hold/wait operation of chamber B's conditioning recipe. Such synchronization would ensure that the second deposition operation of chamber A's process recipe and the deposition operation of chamber B's deposition recipe terminate approximately simultaneously, even if for some reason (e.g. a fault of some kind) the completion of the first deposition operation of chamber A's process recipe were delayed.

The above discussed techniques for inter-chamber synchronization could be applied to situations where it is desired to make an event in one chamber have an effect on the performance of a recipe in a second chamber in ways not shown in the above examples (i.e. some effect other than causing transition between two predetermined operations that are always performed as part of the second chamber's recipe).

Figure 8:
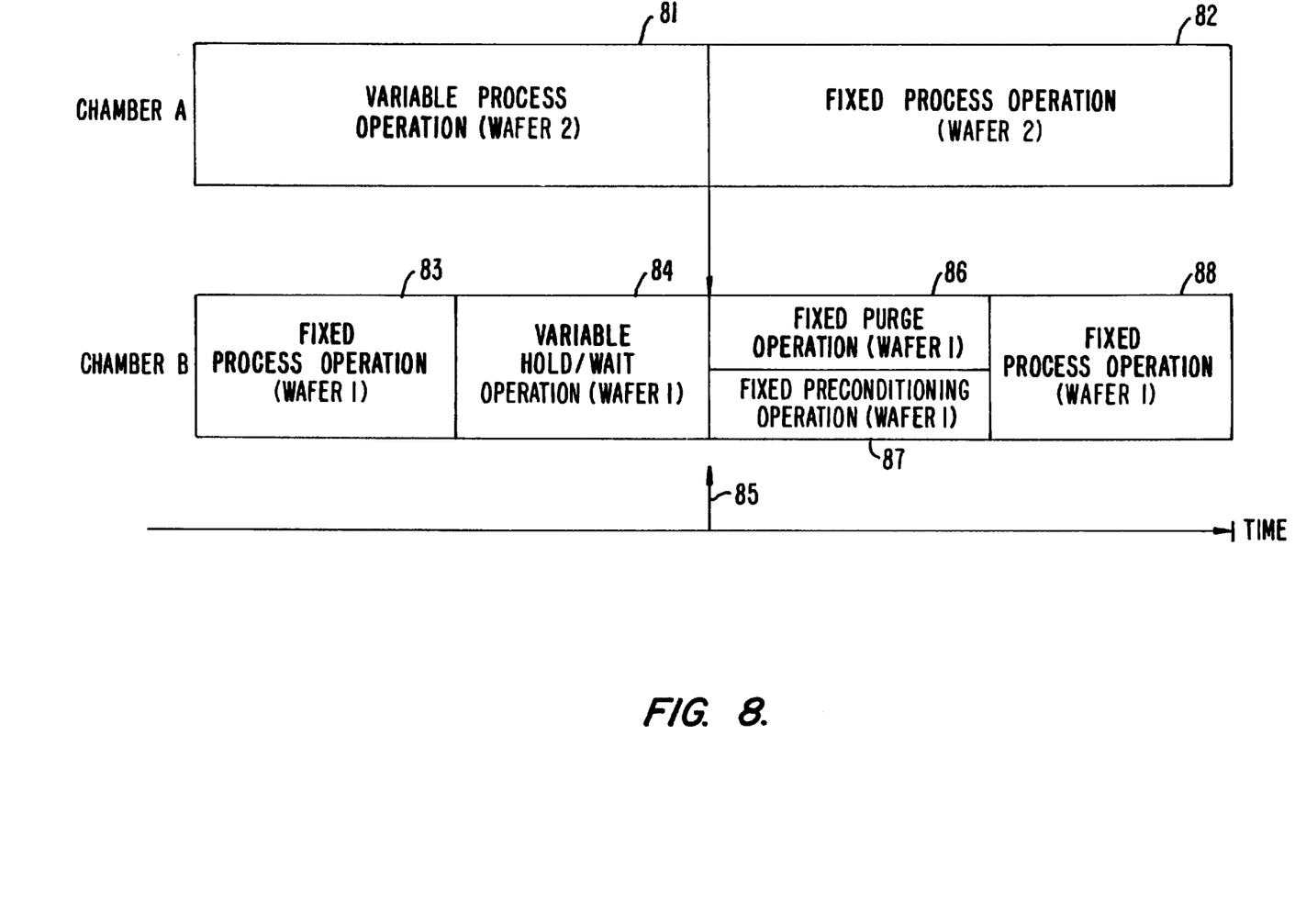
FIG. 8 illustrates an inter-chamber synchronization technique used to synchronize operations carried out in two chambers (A and B), whereby the timing of an event during the execution of a process recipe performed in chamber A determines which of two operations is carried out during the execution of a process recipe performed in chamber B.

FIG. 8 illustrates such a situation. Using the above inter-chamber synchronization technique, the termination of a variable-length process operation 81 in chamber A triggers the termination of variable hold/wait operation 84 in chamber B. Upon terminating operation 84, chamber B's chamber manager determines the length of operation 84. If the length of operation 84 is above a predetermined threshold, chamber B's chamber manager starts a fixed preconditioning operation 87, in order to minimize any possible idle effect in chamber B. Otherwise, chamber B's chamber manager starts a fixed purge operation 86. In this example, events in a first chamber not only affect the timing of operation transitions in a second chamber, but also determine which operations of the second chamber's recipe will be performed.

Calculating the Duration of Variable-Length Cleans

Several of the above examples of inter-chamber synchronization have included variable-length clean operations (e.g. operation 25 of FIG. 3, operation 45 of (FIG. 4). One commonly used technique for determining the length of such an operation is endpoint detection. Endpoint detection relies on a change in the chamber concentration of a particular chemical species to signal the end of the cleaning process. Typically, such a change in concentration is reflected as a sudden change in a monitored optical signal. However, some types of clean operations (such as thermal cleans) do not involve light emissions and, thus, may require far more expensive means (such as a mass spectrometer) to detect the dramatic change in the chamber concentration of endpoint detection species. Still other types of clean operations may not even provide a reliable endpoint detection criterion.

Another technique that has been used to determine the length of a variable-length clean operation (in cases where there is not a reliable endpoint detection criterion or an economically feasible technique to measure the criterion), involves an a priori calculation by a chamber operator of the clean operation length using knowledge of the operations that have been performed in the chamber since the last clean, and an estimate of the clean time required per operation (previously determined through experimentation in the chamber). This technique involves human intervention and thus is expensive and prone to error.

The present inventors have developed a more reliable and cheaper approach that uses the system control software to calculate a length for a variable-length clean operation. This approach is based on the knowledge that the software has of the various operations that have been performed in the chamber since the last clean. One example is shown in FIG. 4.

At approximately time 49, when sequencer 175 determines that it must direct chamber manager 177a to perform a clean recipe in poly chamber 11 and chamber manager 177b to perform a conditioning recipe in $WSi_x$ chamber 13 (consisting of operations 45–47), sequencer 175 calculates a floor on the length of operation 45 by forming the product R*Y where R represents an estimated clean time (stored in memory 23) required per wafer deposition and X represents the current value of the count (also stored in memory 23) of wafers depositions performed in $WSi_x$ chamber 13 since the last clean of chamber 13. In one embodiment, sequencer 175 adds to the product R*X a predetermined additional cleaning time required on account of the precoating operation performed in $WSi_x$ chamber 13 since the last clean of chamber 13. In other embodiments, additional offsets (corresponding to other types of operations performed in $WSi_x$ chamber 13 since the last clean of chamber 13) could also be summed into the calculation of the final length for the variable-length clean operation. This proposed technique could be applied to calculating a length for various types of variable-length operations other than clean operations.

The above description is illustrative and not restrictive. For example, the invention is applicable to synchronizing the terminations of operation types other than those included in the above examples, such as etching operations. For example, the invention could be applied to a deposition/etchback/deposition application in a multi-chamber system that includes chambers for performing $SiO_2$ deposition and etchback operations, respectively.

In addition, the invention is also applicable to synchronizing recipes executed in two or more single-chamber systems. The scope of the invention should, therefore, be determined not with reference to the above description, but instead should be determined with reference to the appended claims along with their full scope of equivalents.

What is claimed is:

1. A computer-implement method of achieving interchamber synchronization in a system for integrated circuit manufacturing, the system including first and second chambers, the method comprising the steps of:
    carrying out a first recipe in the first chamber, the first recipe including a first operation; and
    carrying out a second recipe in the second chamber, wherein the second recipe includes a second operation and the second operation terminates in response to termination of the first operation.

2. The method of claim 1, wherein the first and second chambers comprise two chambers in a multi-chamber system.

3. The method of claim 1, wherein the first operation comprises a variable-length operation.

4. The method of claim 3, wherein the first recipe comprises a process recipe and the second recipe comprises a conditioning recipe.

5. The method of claim 3, wherein the first recipe comprises a conditioning recipe and the second recipe comprises a process recipe.

6. The method of claim 3, wherein the first and second recipes comprise process recipes.

7. The method of claim 3, wherein the first and second recipes comprise conditioning recipes.

8. The method of claim 7, wherein:
the variable-length operation of the first recipe comprises a clean operation; and
the second operation comprises a variable-length conditioning operation.

9. The method of claim 8, wherein:
the first recipe includes a step of precoating having a fixed length of y minutes;
the second recipe includes a third operation, the third operation being a step of purging that starts upon termination of the second operation; and
the method further includes the steps of:
after the third operation terminates, performing a deposition operation having a fixed length of x minutes on a wafer in the second chamber;
after the clean operation terminates, performing the precoating operation in the first chamber, the third operation having a fixed length of y-x minutes, whereby the deposition operation in the second chamber terminates approximately simultaneously with the precoating operation in the first chamber; and
after the deposition operation in the second chamber terminates, transferring the wafer to the first chamber and performing a deposition operation on the wafer in the first chamber.

10. The method of claim 1, wherein the first operation comprises a fixed-length operation.

11. The method of claim 10, wherein the first recipe comprises a process recipe and the second recipe comprises a conditioning recipe.

12. The method of claim 10, wherein the first recipe comprises a conditioning recipe and the second recipe comprises a process recipe.

13. The method of claim 10, wherein the first and second recipes comprise process recipes.

14. The method of claim 10, wherein the first and second recipes comprise conditioning recipes.

15. The method of claim 14, wherein:
the first operation comprises a clean operation; and
the second operation comprises a variable-length conditioning operation.

16. The method of claim 15, wherein the second recipe includes a third operation that comprises a precoating operation having a fixed length of y minutes, and the method further comprises the steps of:
after the first operation terminates, performing in the first chamber a cleaning operation having a fixed length of y-x minutes, and then a deposition operation on a wafer, wherein the deposition operation has a fixed length of x minutes, whereby the deposition operation in the first chamber terminates approximately simultaneously with the precoating operation in the second chamber; and
after the deposition operation in the first chamber terminates, transferring the wafer to the second chamber and performing a deposition operation on the wafer in the second chamber.

17. The method of claim 1, wherein:
the second recipe includes third and fourth operations; and
the step of carrying out the second recipe includes:
if the length of the second operation exceeds a predetermined value, starting the third operation upon termination of the second operation; and
if the length of the second operation does not exceed the predetermined value, starting the fourth operation upon termination of the second operation.

18. A computer-implemented method of achieving inter-chamber synchronization in a system for integrated circuit manufacturing, the system including first and second chambers, the method including the steps of:
at a plurality of times, scheduling a clean operation in the first chamber;
in response to each scheduling of a clean operation in the first chamber, scheduling a conditioning recipe in the second chamber.

19. The method of claim 18, wherein the conditioning recipe includes a hold/wait operation.

20. The method of claim 18, wherein the conditioning recipe includes a cleaning operation.

21. The method of claim 18, wherein the conditioning recipe includes a precoat operation.

22. The method of claim 18, wherein:
a clean operation is performed in the first chamber whenever a first number of wafers have been processed in the first chamber since the first chamber was last cleaned; and
at one of the times, it is determined that the first number of wafers have been processed in the first chamber since the first chamber was last cleaned.

23. The method of claim 18, wherein:
a clean operation is performed in the first chamber whenever a first number of wafers have been processed in the first chamber since the first chamber was last cleaned; and
at one of the times, it is determined that one less than the first number of wafers have been processed in the first chamber since the first chamber was last cleaned and that a wafer is scheduled to be transferred to the first chamber.

24. The method of claim 18, wherein:
a clean operation is required in the second chamber whenever a first number of wafers have been processed in the second chamber since the second chamber was last cleaned; and
the method further includes the steps of:
at one of the times, determining that more than a second number of wafers have been processed in the second chamber since the second chamber was last cleaned, the second number being smaller than the first number; and
in response to the determining step, including a clean operation in the conditioning recipe.

25. In a system for integrated circuit manufacturing, the system including a chamber, a computer-implemented method for calculating a length for a variable-length operation to be performed in the chamber at a particular time, the method comprising the steps of:
determining that one or more operations have been performed in the chamber during a particular time interval prior to the particular time; and
using information obtained during the determining step to calculate the length for the variable-length operation.

26. The method of claim 25, wherein:

the variable-length operation comprises a clean operation;

the particular time interval starts at a time when the chamber was last cleaned and terminates at the particular time;

the chamber is used for wafer depositions; and the determining step includes determining that a number, X, of wafer depositions have been performed in the chamber during the particular time interval; and the using step includes calculating the product of R*X, the product representing a minimum value for the length of the variable-length operation, wherein R is an estimated clean time required per wafer deposition.

27. The method of claim 26, wherein the length of the variable-length operation is calculated as a sum of R*X and an offset, the offset representing an additional clean time required on account of one or more conditioning operations performed in the chamber during the particular interval.

28. The method of claim 27, wherein the one or more conditioning operations include a precoating operation.

29. A substrate processing system comprising:

a first chamber;

a second chamber; and a controller including a memory, the memory storing computer-readable instructions for carrying out first and second recipes in the first and second chambers, respectively, wherein the first recipe includes a first operation, the second recipe includes a second operation and the second operation terminates in response to termination of the first operation.

30. The system of claim 29, wherein the system comprises a multi-chamber system.

31. The system of claim 29, wherein the first operation comprises a variable-length operation.

32. A substrate processing system comprising:

a first chamber;

a second chamber; and a controller including a memory, the memory storing computer-readable instructions for periodically scheduling a clean operation in the first chamber and for scheduling a conditioning recipe in the second chamber whenever a clean operation in the first chamber is scheduled.

33. The system of claim 32, wherein:

a clean operation is performed in the first chamber whenever a first number of wafers have been processed in the first chamber since the first chamber was last cleaned.

34. The system of claim 32, wherein:

a clean operation is required in the second chamber whenever a first number of wafers have been processed in the second chamber since the second chamber was last cleaned; and the memory stores computer-readable instructions for determining, whenever a clean operation in the first chamber is scheduled, whether or not more than a second number of wafers have been processed in the second chamber since the second chamber was last cleaned, and for including a clean operation in the conditioning recipe if more than the second number of wafers have been processed in the second chamber since the second chamber was last cleaned; and the second number is smaller than the first number.

35. A substrate processing system comprising:

a chamber in which a variable-length operation is to be performed at a particular time; and a controller including a memory, the memory storing computer-readable instructions for determining which operations have been performed in the chamber during a particular time interval prior to the particular time and for calculating the length for the variable-length operation as a function of the operations determined to have been performed in the chamber during the particular time interval.

36. The system of claim 35, wherein:

the variable-length operation comprises a clean operation;

the particular time interval starts at a time when the chamber was last cleaned and terminates at the particular time;

the chamber is used for wafer depositions; and the memory stores computer-readable instructions for determining that a number, X, of wafer depositions have been performed in the chamber during the particular time interval and for calculating the product of R*X, the product representing a minimum value for the length of the variable-length operation, wherein R is an estimated clean time required per wafer deposition.

37. The system of claim 36, wherein the memory stores computer-readable instructions for calculating the length of the variable-length operation as a sum of R*X and an offset, the offset representing an additional clean time required on account of one or more conditioning operations performed in the chamber during the particular interval.

38. The system of claim 37, wherein the one or more conditioning operations include a precoating operation.

39. In a multichamber substrate processing system including at least a first substrate processing chamber and a second substrate processing chamber, a computer implemented method of achieving synchronization between the first and second chambers, the method comprising the steps of:

(a) carrying out a first chamber operation in the first substrate processing chamber;

(b) simultaneous with step (a), carrying out a second chamber operation in the second substrate processing chamber; and (c) terminating the second chamber operation in response to the termination of the first chamber operation.

* * * * *